(12) United States Patent
Miyamoto et al.

(10) Patent No.: US 12,707,923 B2
(45) Date of Patent: Aug. 11, 2026

(54) SUBSTRATE CONVEYANCE METHOD, SUBSTRATE PROCESSING DEVICE, AND RECORDING MEDIUM

(71) Applicant: EBARA CORPORATION, Tokyo (JP)

(72) Inventors: Matsutaro Miyamoto, Tokyo (JP); Ryuichi Kosuge, Tokyo (JP); Masumi Nishijima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 699 days.

(21) Appl. No.: 18/079,876

(22) Filed: Dec. 13, 2022

(65) Prior Publication Data

US 2023/0230863 A1 Jul. 20, 2023

(30) Foreign Application Priority Data

Jan. 19, 2022 (JP) ................................ 2022-006084

(51) Int. Cl.
*H10P 72/00* (2026.01)

(52) U.S. Cl.
CPC ................................ *H10P 72/0606* (2026.01)

(58) Field of Classification Search
CPC ......... H01L 21/67259; H01L 21/67028; H01L 21/67253; H01L 21/677; H01L 21/67242; H01L 21/6704; H01L 21/67219; H01L 21/67742; H10P 72/0606; H10P 72/0604; H10P 72/0406; H10P 72/06; H10P 72/30; H10P 72/0411; H10P 72/0472; H10P 72/3302
See application file for complete search history.

(56) References Cited

U.S. PATENT DOCUMENTS 5,844,683 A * 12/1998 Pavloski ........... H01L 21/67167 356/399
8,128,458 B2 * 3/2012 Saito ....................... B24B 49/12 451/6
2010/0093260 A1 * 4/2010 Kobayashi ............ B24B 37/013 451/6
2016/0315002 A1 * 10/2016 Komatsu ............. B24B 37/0053
2017/0287755 A1 * 10/2017 Tanaka .............. H01L 21/67742
2021/0144270 A1 * 5/2021 Togashi ............... H04N 1/0057

FOREIGN PATENT DOCUMENTS

CN 103964233 A * 8/2014 ........... H01L 23/544
CN 104714376 A * 6/2015 ....... H01L 21/67253
EP 0249762 A1 * 12/1987 ........... H01L 23/544
JP H06211334 A * 8/1994 ....... H01L 21/67253
(Continued)

OTHER PUBLICATIONS

"Office Action of Singapore Counterpart Application", issued on Oct. 15, 2025, p. 1-p. 9.

*Primary Examiner* — Mohammed Shamsuzzaman
(74) *Attorney, Agent, or Firm* — JCIPRNET

(57) ABSTRACT

A substrate conveyance method, a substrate processing device, and a recording medium are provided. The substrate conveyance method includes: conveying a substrate into a receiving unit and confirming that the substrate is present in the receiving unit by detecting that light irradiated from an optical sensor is blocked by the substrate conveyed to the receiving unit; and stopping light irradiation from the optical sensor before the substrate is conveyed out from the receiving unit.

8 Claims, 15 Drawing Sheets

(56) References Cited

FOREIGN PATENT DOCUMENTS

| | | | | | |
|---|---|---|---|---|---|
| JP | H10298787 | A | * | 11/1998 | ........... H01L 23/544 |
| JP | H1148057 | A | * | 2/1999 | ....... H01L 21/67253 |
| JP | 2005251864 | A | * | 9/2005 | ....... H01L 21/67253 |
| JP | 2006140418 | A | * | 6/2006 | ....... H01L 21/67253 |
| JP | 2007184309 | A | * | 7/2007 | ....... H01L 21/67253 |
| JP | 2008277634 | | | 11/2008 | |
| JP | 2010050436 | | | 3/2010 | |
| JP | 2017146152 | | | 8/2017 | |
| JP | 2017188523 | | | 10/2017 | |
| JP | 2017212323 | A | * | 11/2017 | ....... H01L 21/67253 |
| KR | 20050030261 | A | * | 3/2005 | ........... G03F 9/7088 |
| KR | 101109528 | B1 | * | 1/2012 | ........... H01L 23/544 |
| WO | WO-2018105031 | A1 | * | 6/2018 | ............... G01V 8/12 |

* cited by examiner (a)

(b)

SUBSTRATE CONVEYANCE METHOD, SUBSTRATE PROCESSING DEVICE, AND RECORDING MEDIUM

CROSS-REFERENCE TO RELATED APPLICATION

This application claims the priority benefits of Japanese application no. 2022-006084, filed on Jan. 19, 2022. The entirety of the above-mentioned patent application is hereby incorporated by reference herein and made a part of this specification.

BACKGROUND

Technical Field

The disclosure relates to a substrate conveyance method, a substrate processing device, and a non-transitory computer-readable recording medium recording a program for operating components of the substrate processing device.

Related Art

A substrate processing device for processing substrates such as wafers is known (see Patent Literature 1: JP-A-2010-050436, for example). In such a substrate processing device, wafers are conveyed to various modules and processed in each module.

A substrate processing device includes an optical sensor that detects whether or not a wafer is present on its conveyance stage. As the wafer is conveyed to each module, the wafer is conveyed to the next module after its presence is detected by the optical sensor.

In recent years, as semiconductor devices have become highly integrated and highly densified, circuit wiring has become increasingly finer, and the number of layers in multilayer wiring has also increased. Thus, when a wafer is irradiated with light emitted from the optical sensor, the metal formed on a front surface of the wafer (more specifically, device surface) is affected by the light, and the metal corrodes. In other words, photocorrosion occurs on the front surface of the wafer.

Accordingly, the disclosure provides a substrate conveyance method, a substrate processing device, and a recording medium capable of preventing photocorrosion from occurring on the front surface of a substrate (such as wafer).

SUMMARY

In one aspect, a substrate conveyance method in a substrate processing device is provided, in which a substrate is conveyed into a receiving unit for the substrate, and that the substrate is present in the receiving unit is confirmed by detecting that light irradiated from an optical sensor is blocked by the substrate conveyed to the receiving unit; and light irradiation from the optical sensor is stopped before the substrate is conveyed out from the receiving unit.

In one aspect, a substrate processing device includes: a receiving unit for a substrate; an optical sensor detecting presence or absence of the substrate conveyed to the receiving unit; and a control device controlling a light projecting operation of the optical sensor. The control device conveys the substrate into the receiving unit and confirms that the substrate is present in the receiving unit by detecting that light irradiated from the optical sensor is blocked by the substrate conveyed to the receiving unit, and tops light irradiation from the optical sensor before the substrate is conveyed out from the receiving unit.

In one aspect, a non-transitory computer-readable recording medium that records a program is provided to causes a computer to: convey a substrate into a receiving unit for the substrate and confirm that the substrate is present in the receiving unit by detecting that light irradiated from an optical sensor is blocked by the substrate conveyed to the receiving unit, and stop light irradiation from the optical sensor before the substrate is conveyed out from the receiving unit.

Figure 2:
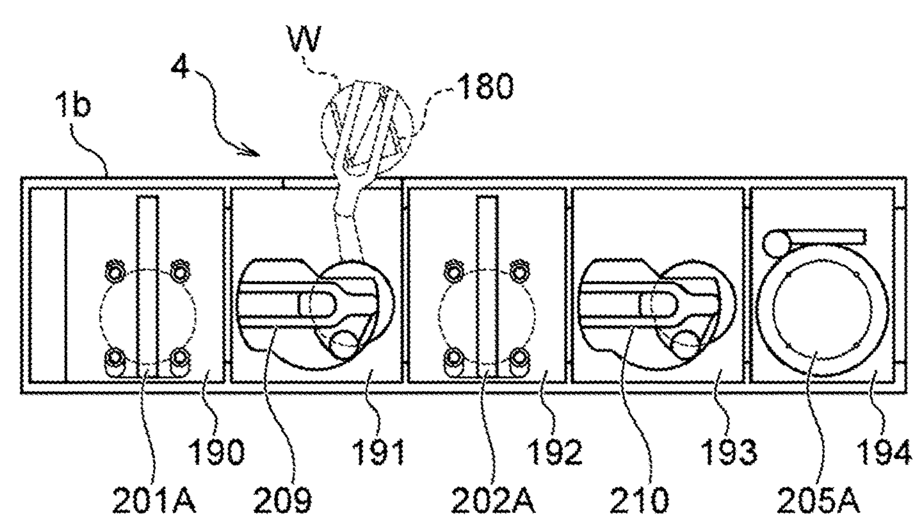
Figure 2:
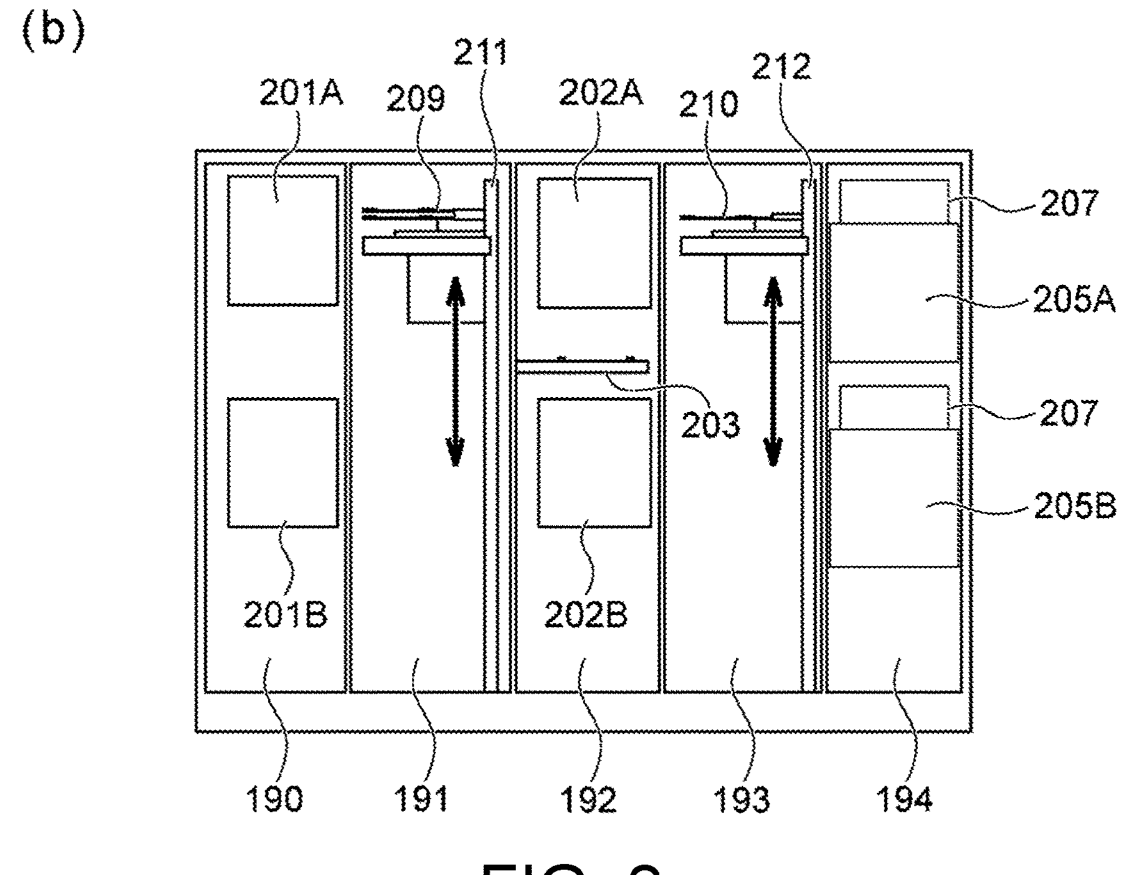

(a) of FIG. 2 is a plan view illustrating a cleaning portion, and (b) of FIG. 2 is a side view illustrating the cleaning portion.

Figure 3:
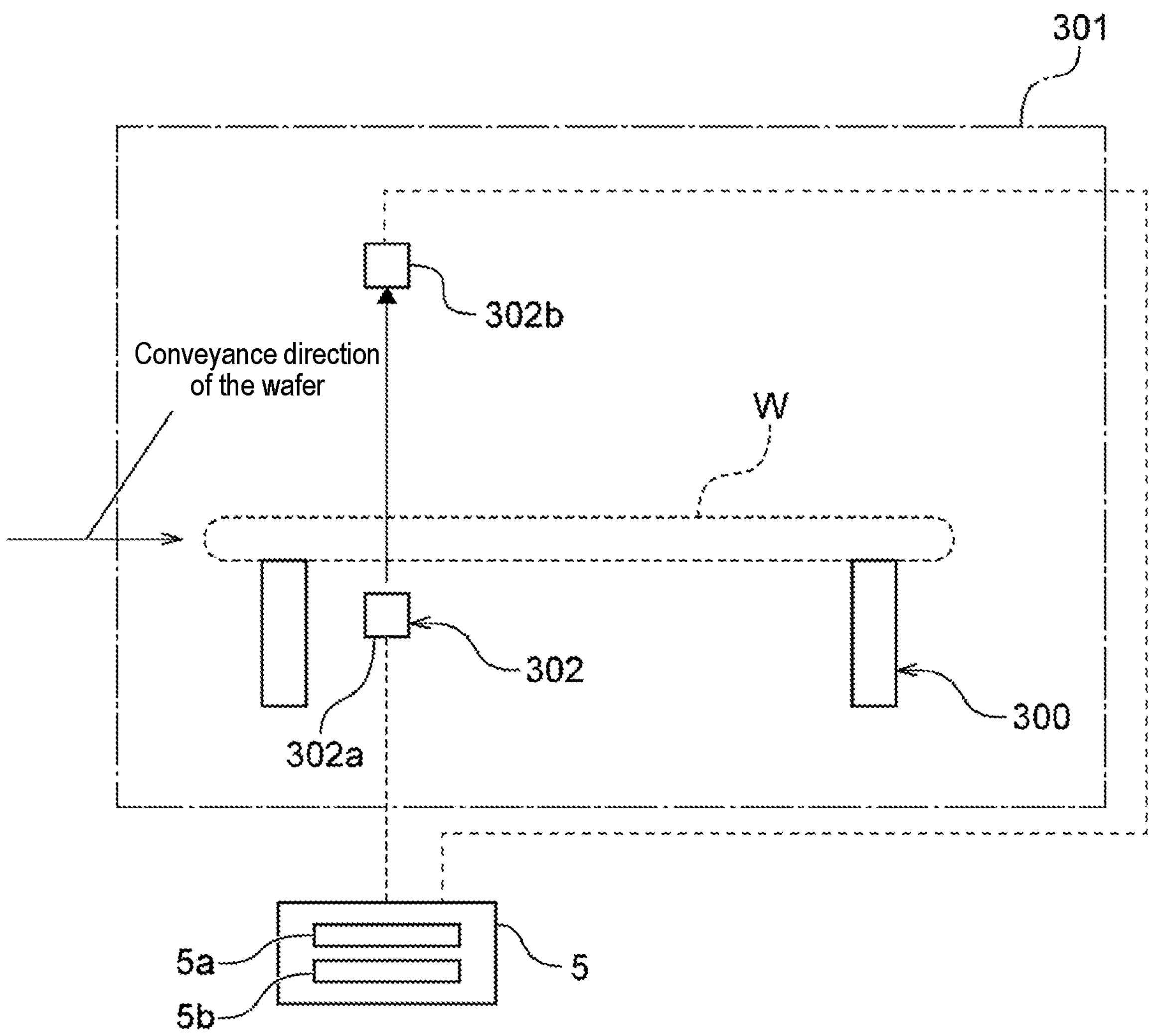

FIG. 3 is a view illustrating a transfer station arranged on a conveyance path of a wafer.

Figure 4:
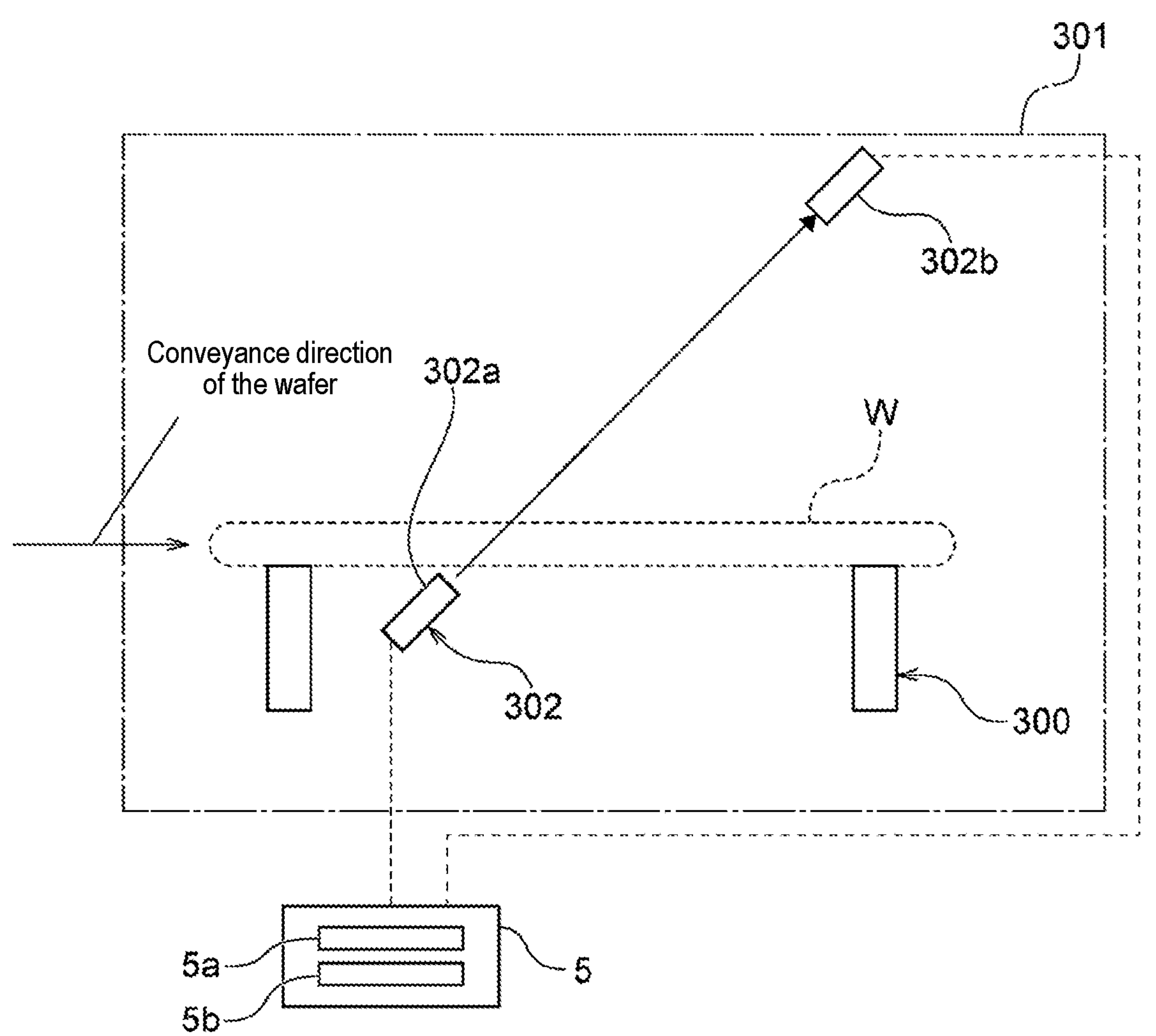

FIG. 4 is a view illustrating another embodiment of a light projecting portion and a light receiving portion.

Figure 5:
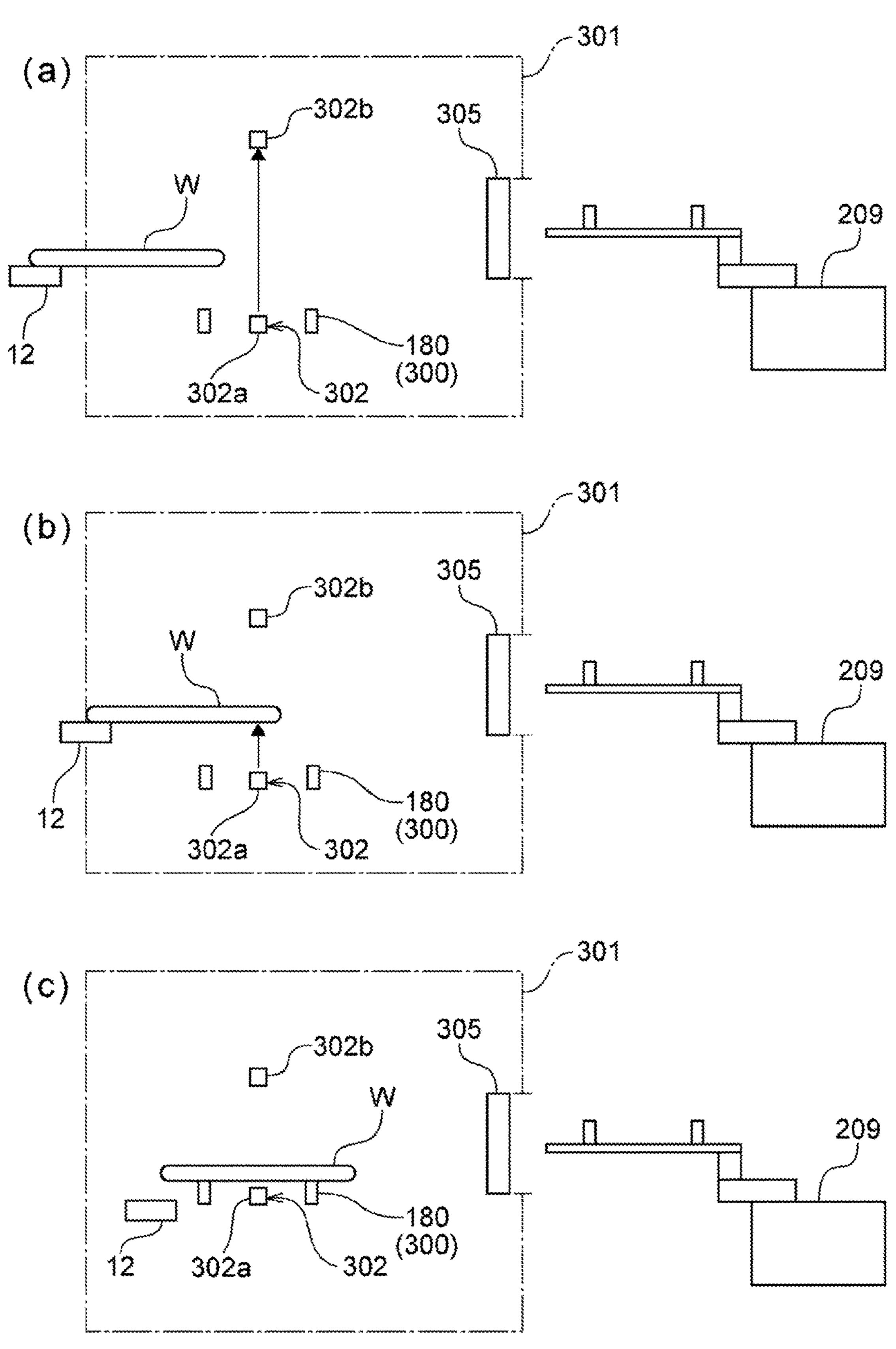

(a) to (c) of FIG. 5 are views illustrating a wafer conveyed into a transfer station.

Figure 6:
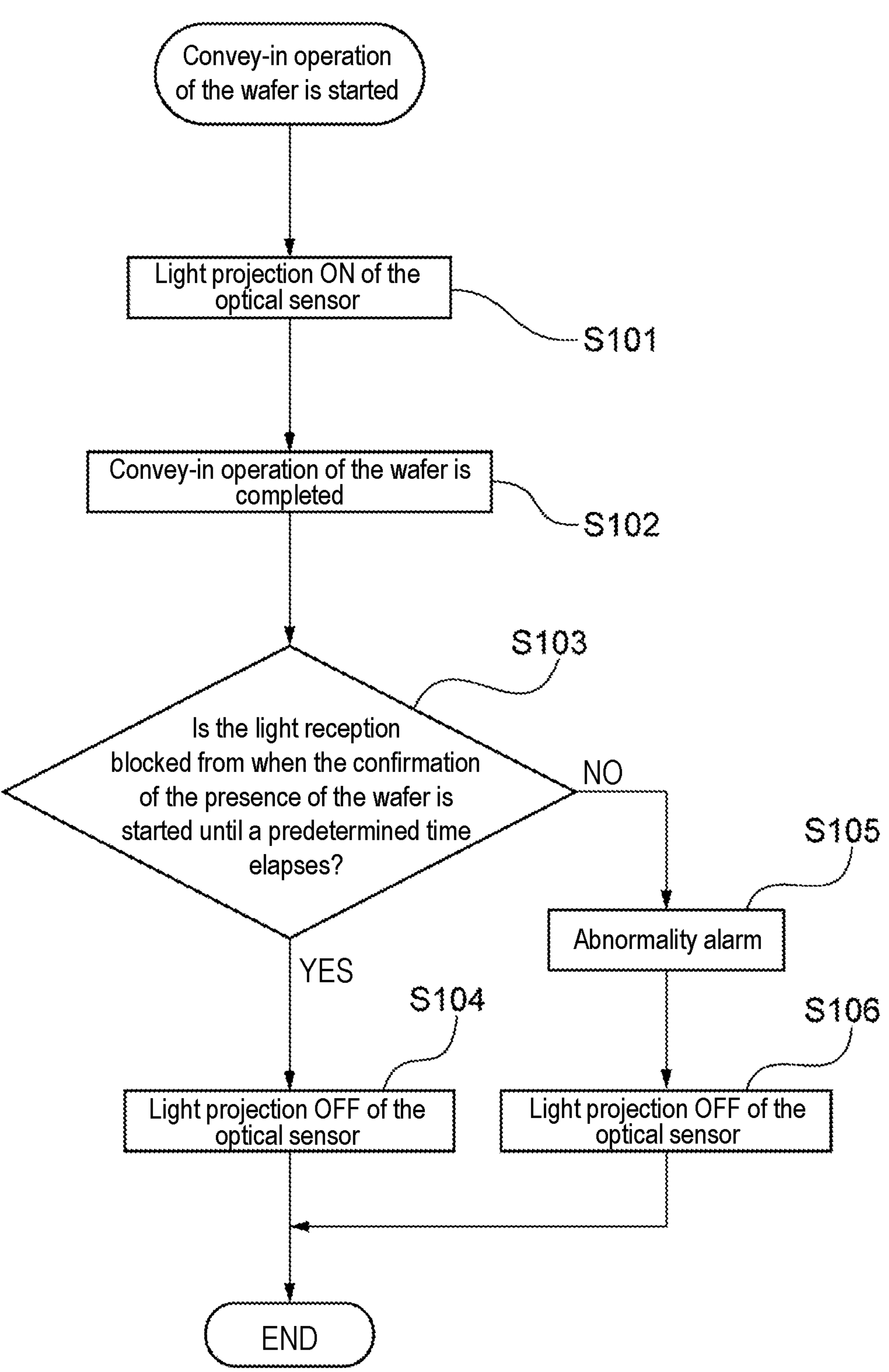

FIG. 6 is a view illustrating a control flow of light projecting operation of an optical sensor by a control device when a wafer is conveyed into a transfer station.

Figure 7:
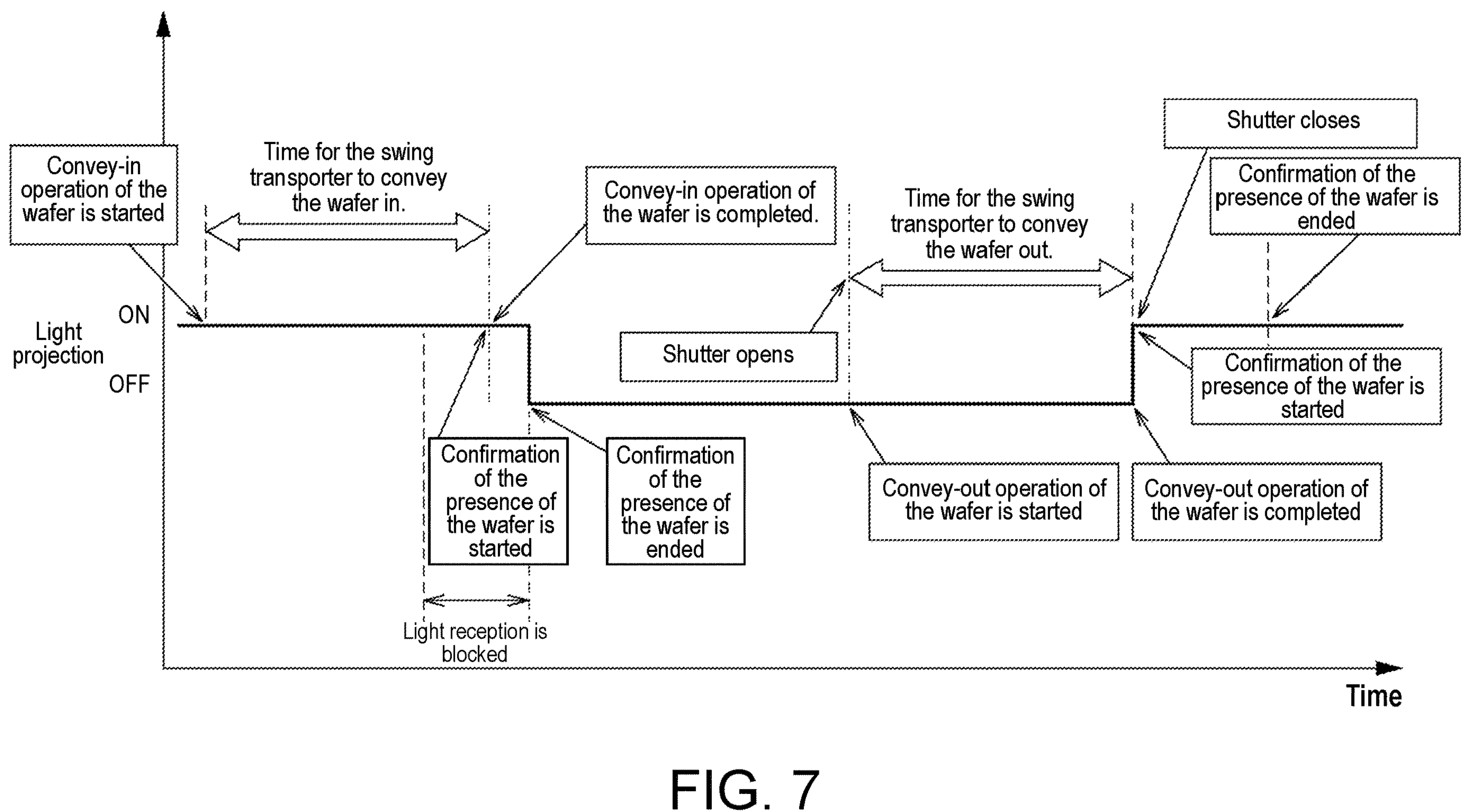

FIG. 7 is a view illustrating one embodiment of an operation of a control device for conveying a wafer into a transfer station and conveying the wafer out from the transfer station.

Figure 8:
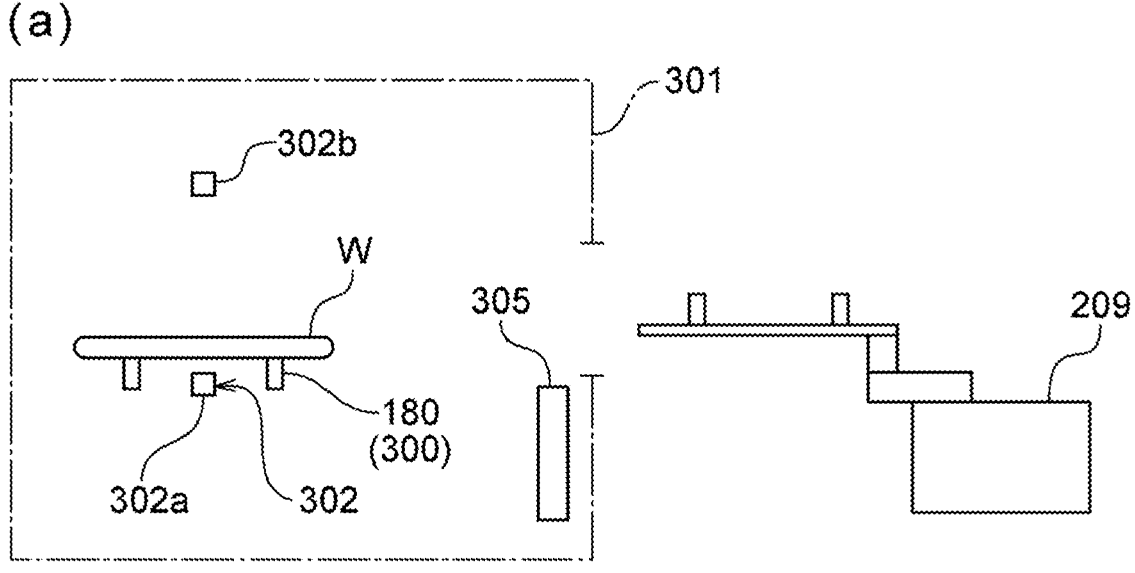
Figure 8:
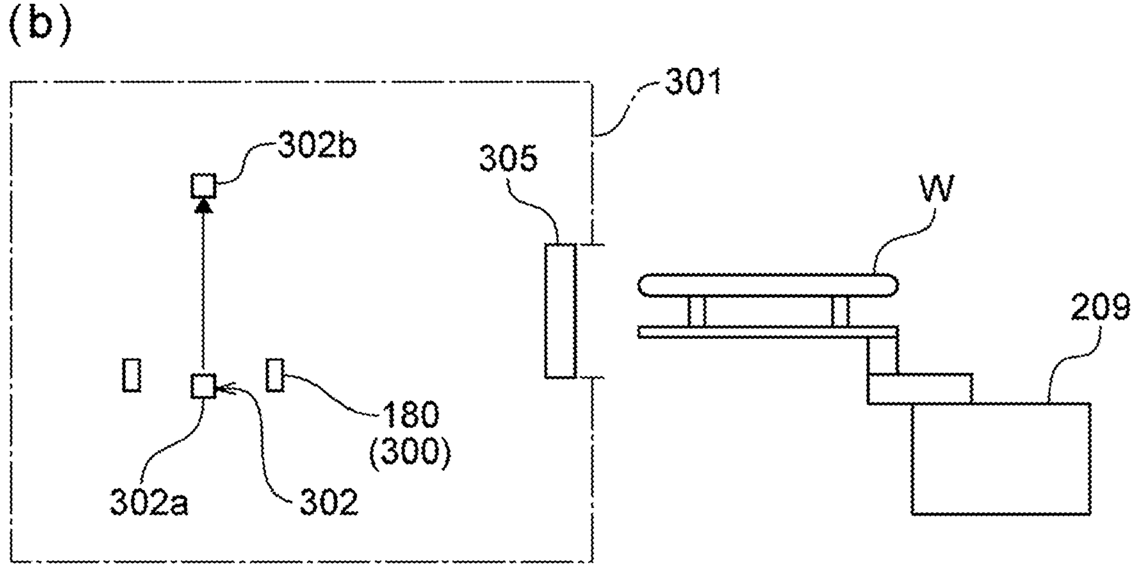

(a) and (b) of FIG. 8 are views illustrating a wafer conveyed out from a transfer station.

Figure 9:
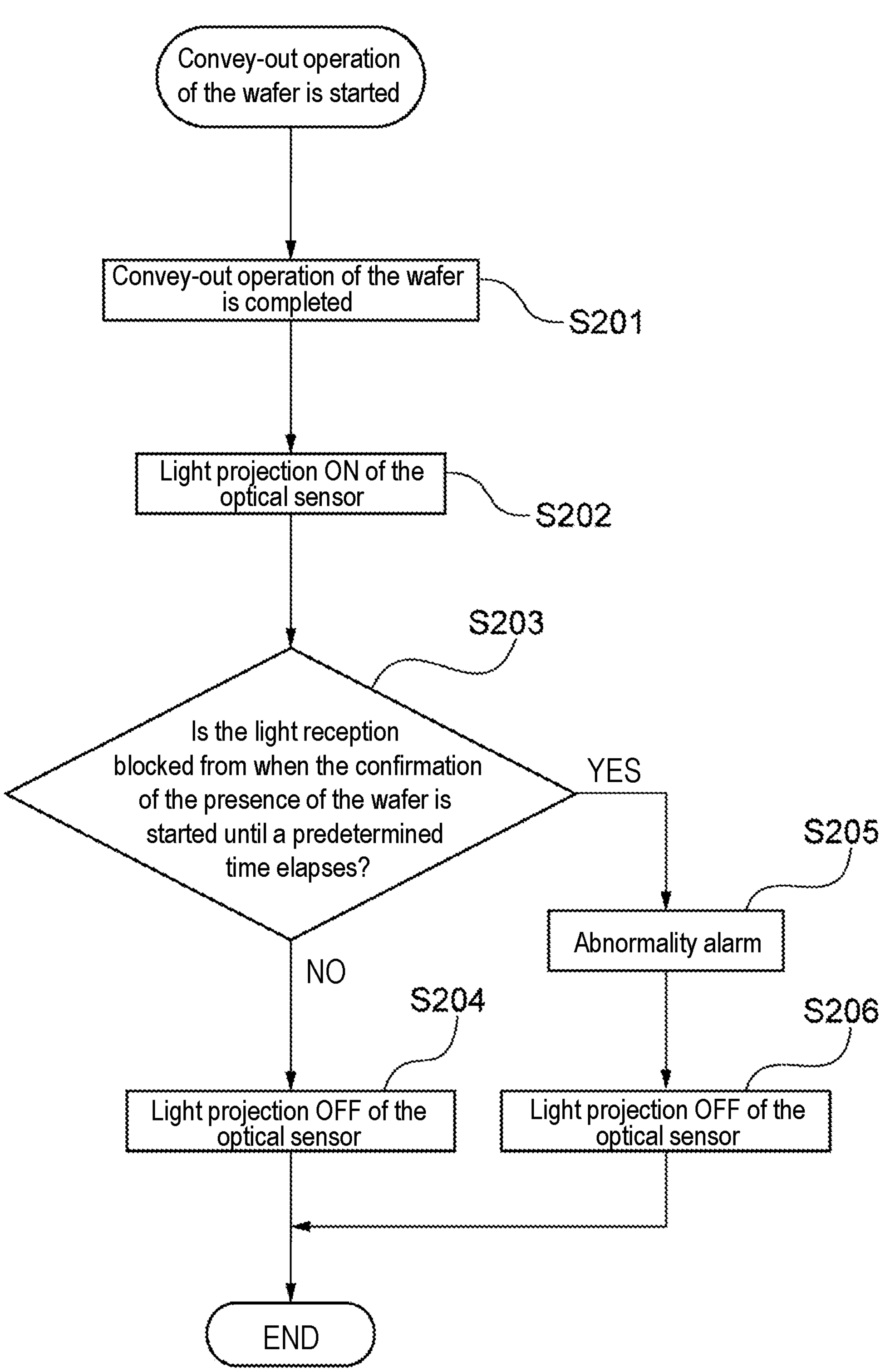

FIG. 9 is a view illustrating a control flow of light projecting operation of an optical sensor by a control device when a wafer is conveyed out from a transfer station.

Figure 10:
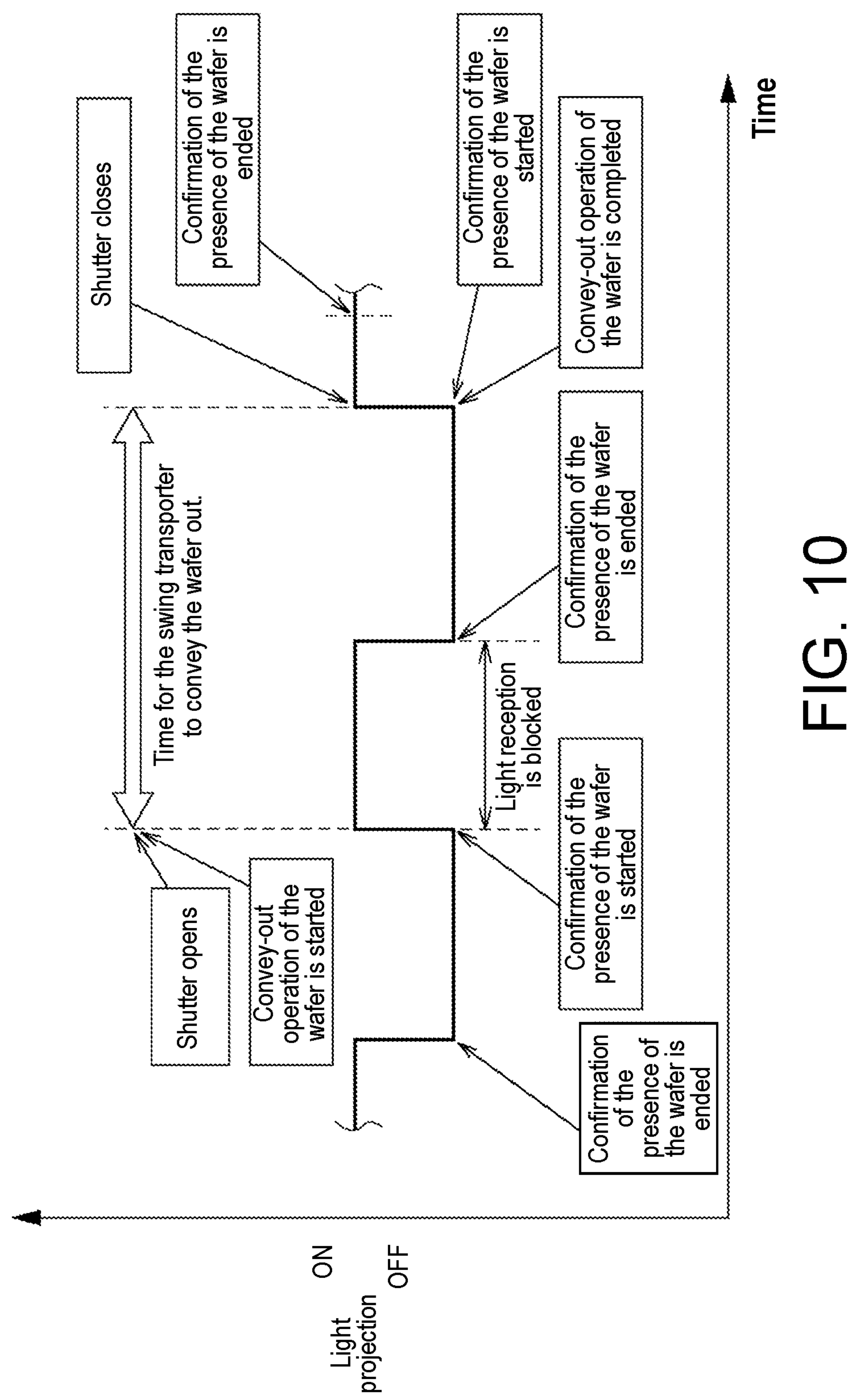

FIG. 10 is a view illustrating how presence of a wafer is confirmed before the wafer is conveyed out from a transfer station.

Figure 11:
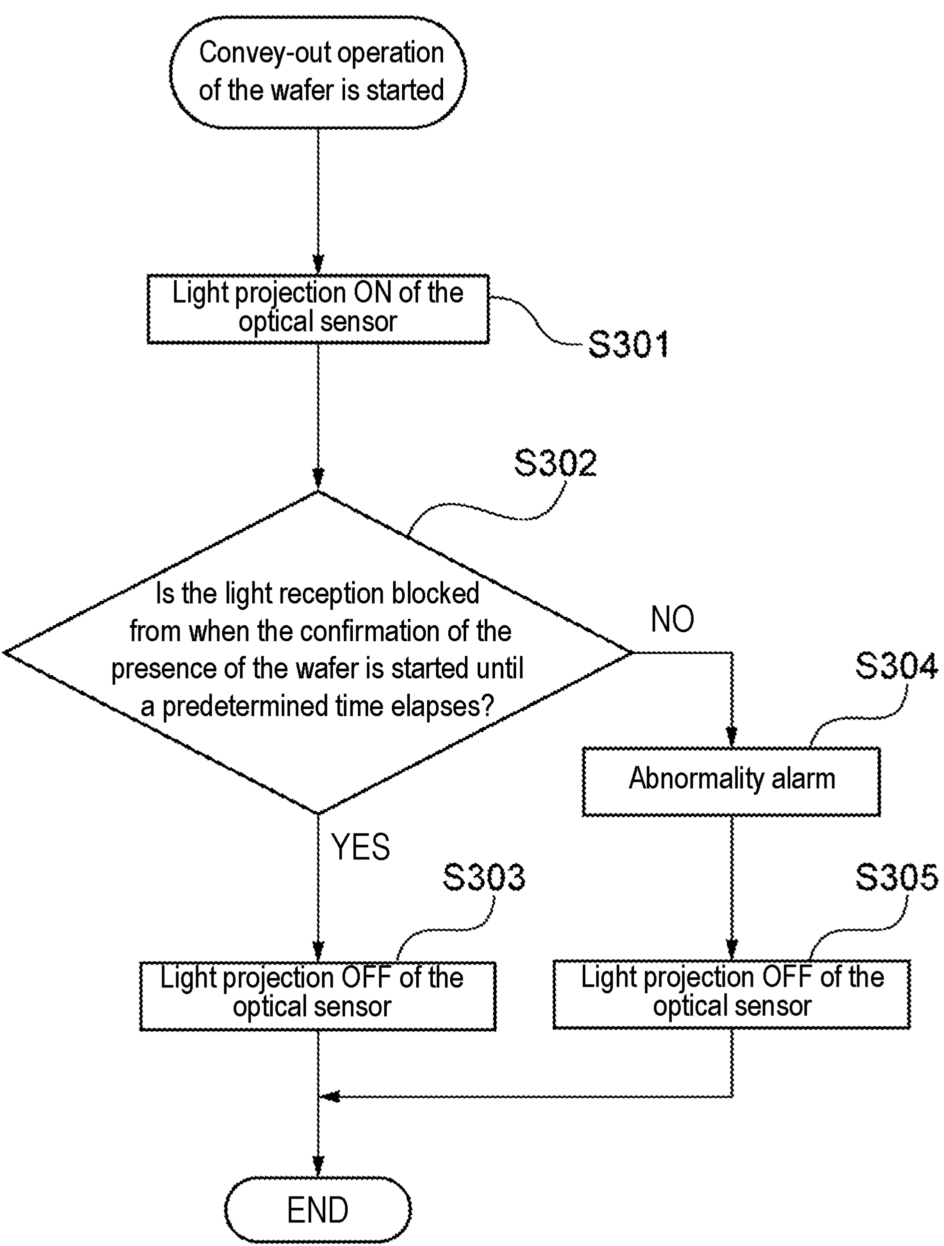

FIG. 11 is a view illustrating a control flow of light projecting operation of an optical sensor by a control device before a wafer is conveyed out from a transfer station.

Figure 12:
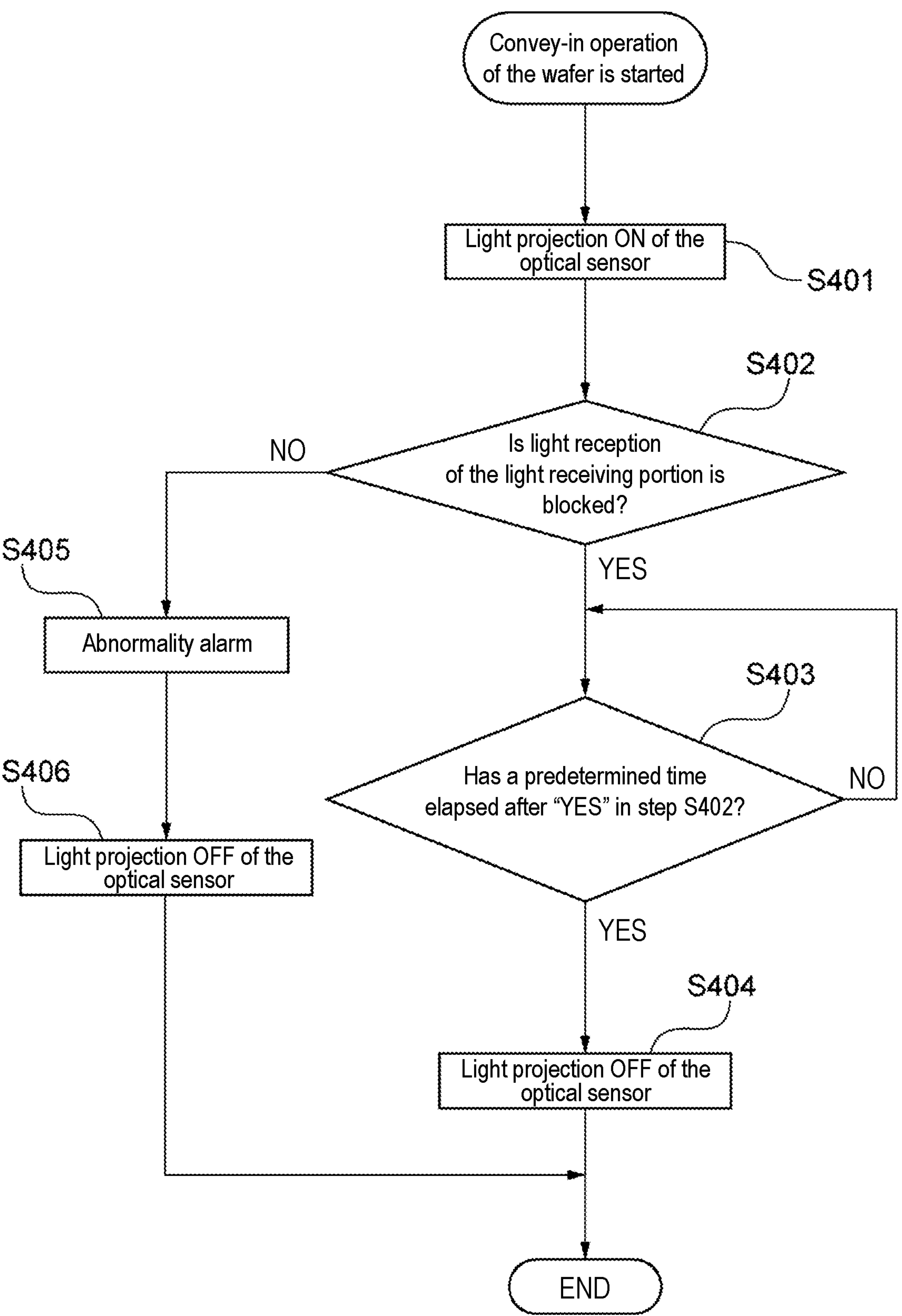

FIG. 12 is a view illustrating a control flow of light projecting operation of an optical sensor by a control device when a wafer is conveyed into a transfer station.

Figure 13:
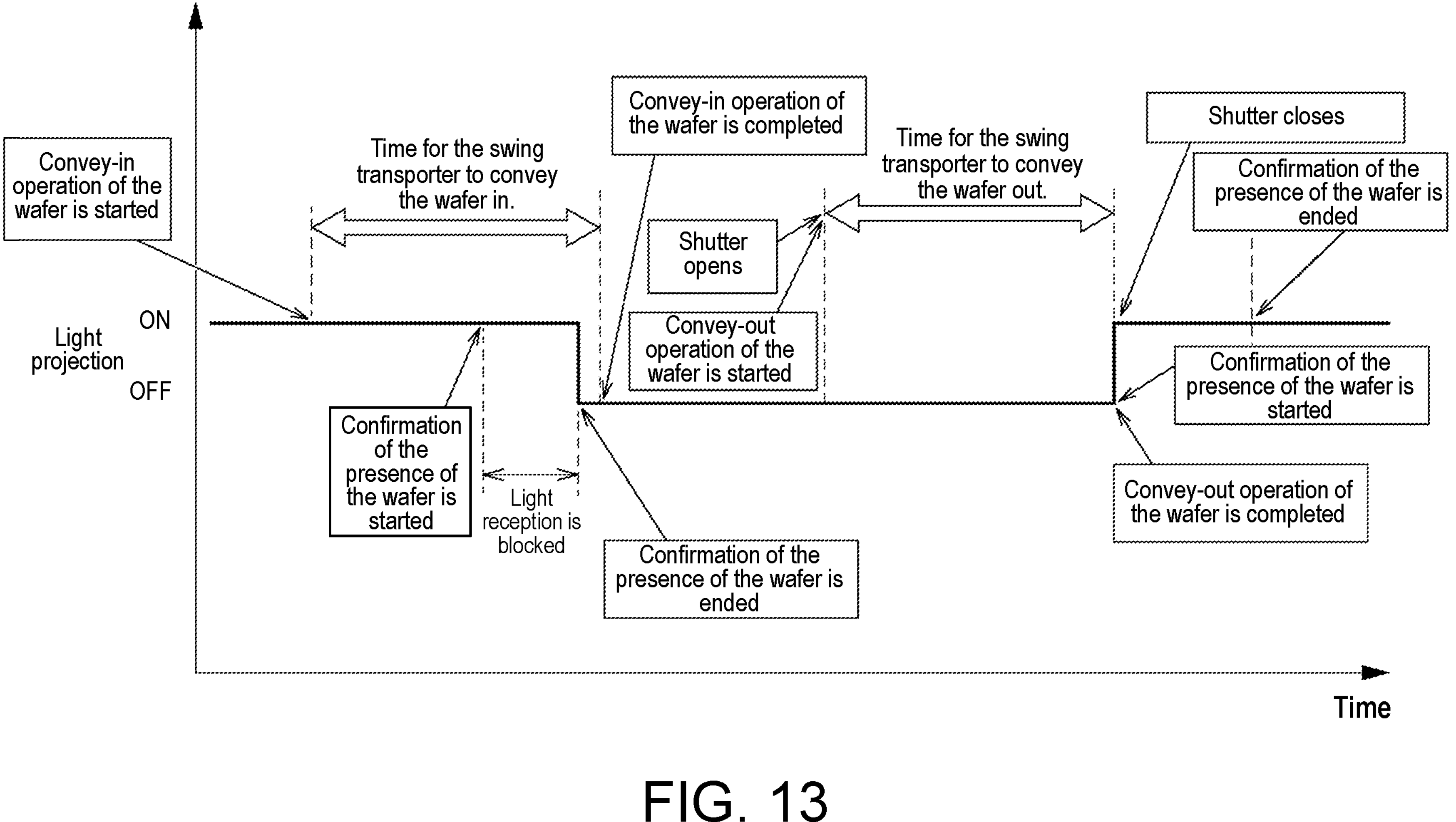

FIG. 13 is a view illustrating another embodiment of an operation of a control device for conveying a wafer into a transfer station and conveying the wafer out from the transfer station.

Figure 14:
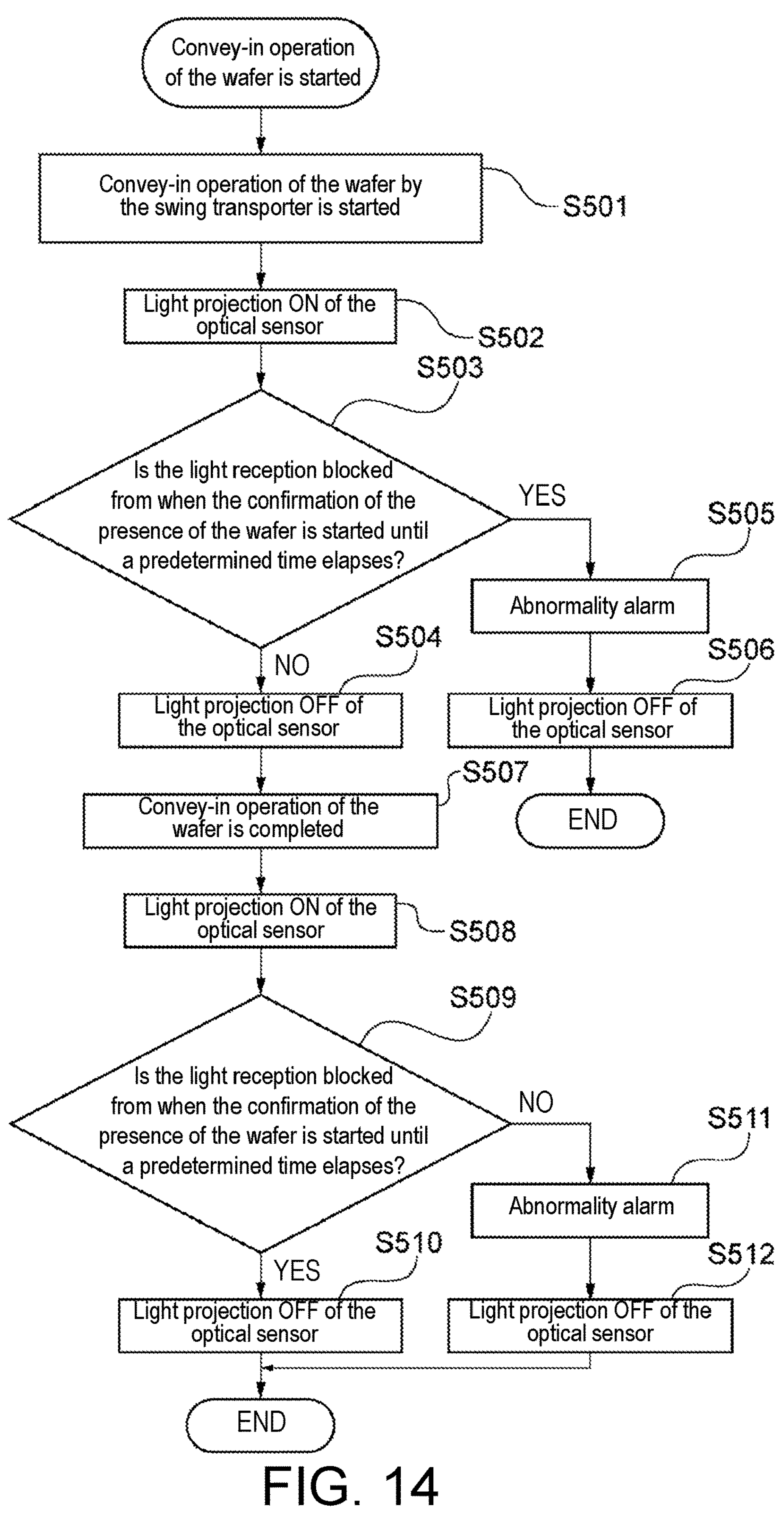

FIG. 14 is a view illustrating a control flow of light projecting operation of an optical sensor by a control device when a wafer is conveyed into a transfer station.

Figure 15:
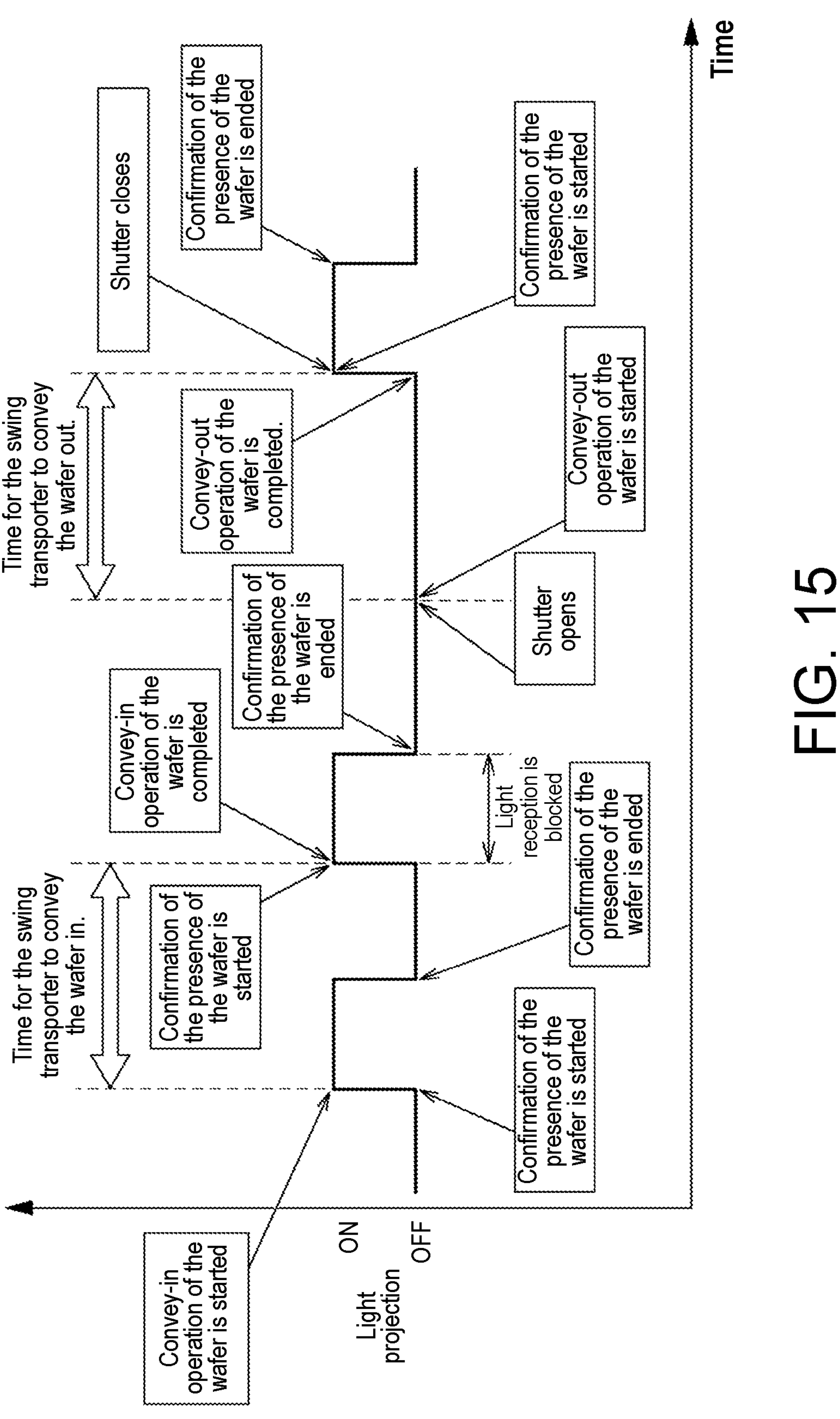

FIG. 15 is a view illustrating another embodiment of an operation of a control device for conveying a wafer into a transfer station and conveying the wafer out from the transfer station.

DESCRIPTION OF THE EMBODIMENTS

In one aspect, the substrate is wet-processed in a wet-processing module arranged on a front stage side of the receiving unit in a conveyance direction of the substrate and wet-processing the substrate, and the substrate wet-processed in the wet-processing module is irradiated with light by the optical sensor.

In one aspect, presence of the substrate in the receiving unit during a period from when the substrate is placed on a placement stage of the receiving unit until a predetermined time elapses is confirmed after light irradiated from the optical sensor is blocked by the substrate conveyed into the receiving unit, and light irradiation from the optical sensor is stopped after the predetermined time has elapsed.

In one aspect, light irradiation from the optical sensor is stopped after a predetermined time has elapsed from when light irradiated from the optical sensor is blocked by the substrate conveyed into the receiving unit.

In one aspect, light irradiation from the optical sensor is started when the substrate is placed on a placement stage of the receiving unit; presence of the substrate in the receiving unit during a period from when the substrate is placed on the placement stage of the receiving unit until a predetermined time elapses is confirmed; and light irradiation from the optical sensor is stopped after the predetermined time has elapsed.

In one aspect, light irradiation from the optical sensor is started before the substrate is conveyed to the receiving unit, and light irradiation from the optical sensor is stopped after that the substrate is not present in the receiving unit is confirmed.

In one aspect, the substrate processing device includes a wet-processing module arranged on a front stage side of the receiving unit in a conveyance direction of the substrate and wet-processing the substrate, and the optical sensor irradiates light on the substrate wet-processed in the wet-processing module.

In one aspect, the control device confirms presence of the substrate in the receiving unit during a period from when the substrate is placed on a placement stage of the receiving unit until a predetermined time elapses after light irradiated from the optical sensor is blocked by the substrate conveyed into the receiving unit; and stops light irradiation from the optical sensor after the predetermined time has elapsed.

In one aspect, the control device stops light irradiation from the optical sensor after a predetermined time has elapsed from when the light irradiated from the optical sensor is blocked by the substrate conveyed into the receiving unit.

In one aspect, the control device starts light irradiation from the optical sensor when the substrate is placed on a placement stage of the receiving unit; presence of the substrate in the receiving unit during a period from when the substrate is placed on the placement stage of the receiving unit until a predetermined time elapses is confirmed; and light irradiation from the optical sensor is stopped after the predetermined time has elapsed.

In one aspect, the control device starts light irradiation from the optical sensor before the substrate is conveyed to the receiving unit and stops light irradiation from the optical sensor after confirming that the substrate is not present in the receiving unit.

In one aspect, the optical sensor includes: a light projecting portion emitting light; a light receiving portion receiving light emitted from the light projecting portion. The light projecting portion is arranged on a back surface side of the substrate conveyed to the receiving unit, and the light receiving portion is arranged on a front surface side of the substrate conveyed to the receiving unit.

In one aspect, the light projecting portion and the light receiving portion are arranged perpendicularly to a conveyance direction of the substrate.

In one aspect, the light projecting portion and the light receiving portion are arranged obliquely with respect to a conveyance direction of the substrate.

In one aspect, the recording medium records a program that causes a computer to: wet-process the substrate in a wet-processing module arranged on a front stage side of the receiving unit in a conveyance direction of the substrate and wet-processing the substrate, and irradiate the substrate wet-processed in the wet-processing module with light by the optical sensor.

In one aspect, the recording medium records a program that causes a computer to: confirm presence of the substrate in the receiving unit during a period from when the substrate is placed on a placement stage of the receiving unit until a predetermined time elapses after light irradiated from the optical sensor is blocked by the substrate conveyed into the receiving unit, and stop light irradiation from the optical sensor after the predetermined time has elapsed.

In one aspect, the recording medium records a program that causes a computer to: stop light irradiation from the optical sensor after a predetermined time has elapsed from when light irradiated from the optical sensor is blocked by the substrate conveyed into the receiving unit.

In one aspect, the recording medium records a program that causes a computer to: start light irradiation from the optical sensor when the substrate is placed on a placement stage of the receiving unit; confirm presence of the substrate in the receiving unit during a period from when the substrate is placed on the placement stage of the receiving unit until a predetermined time elapses; and stop light irradiation from the optical sensor after the predetermined time has elapsed.

According to the substrate conveyance method, the substrate is conveyed into the transfer station and irradiated with light from the optical sensor. Light irradiation is stopped before the substrate is conveyed out from the transfer station. Thus, the problem that the light from the optical sensor continues to irradiate on the wafer W does not occur. As a result, photocorrosion can be prevented from occurring on a front surface of the substrate.

Embodiments of a substrate processing device according to the disclosure will be described in detail below with reference to the drawings. The same or corresponding components are denoted by the same reference numerals, and redundant explanations are omitted.

Figure 1:
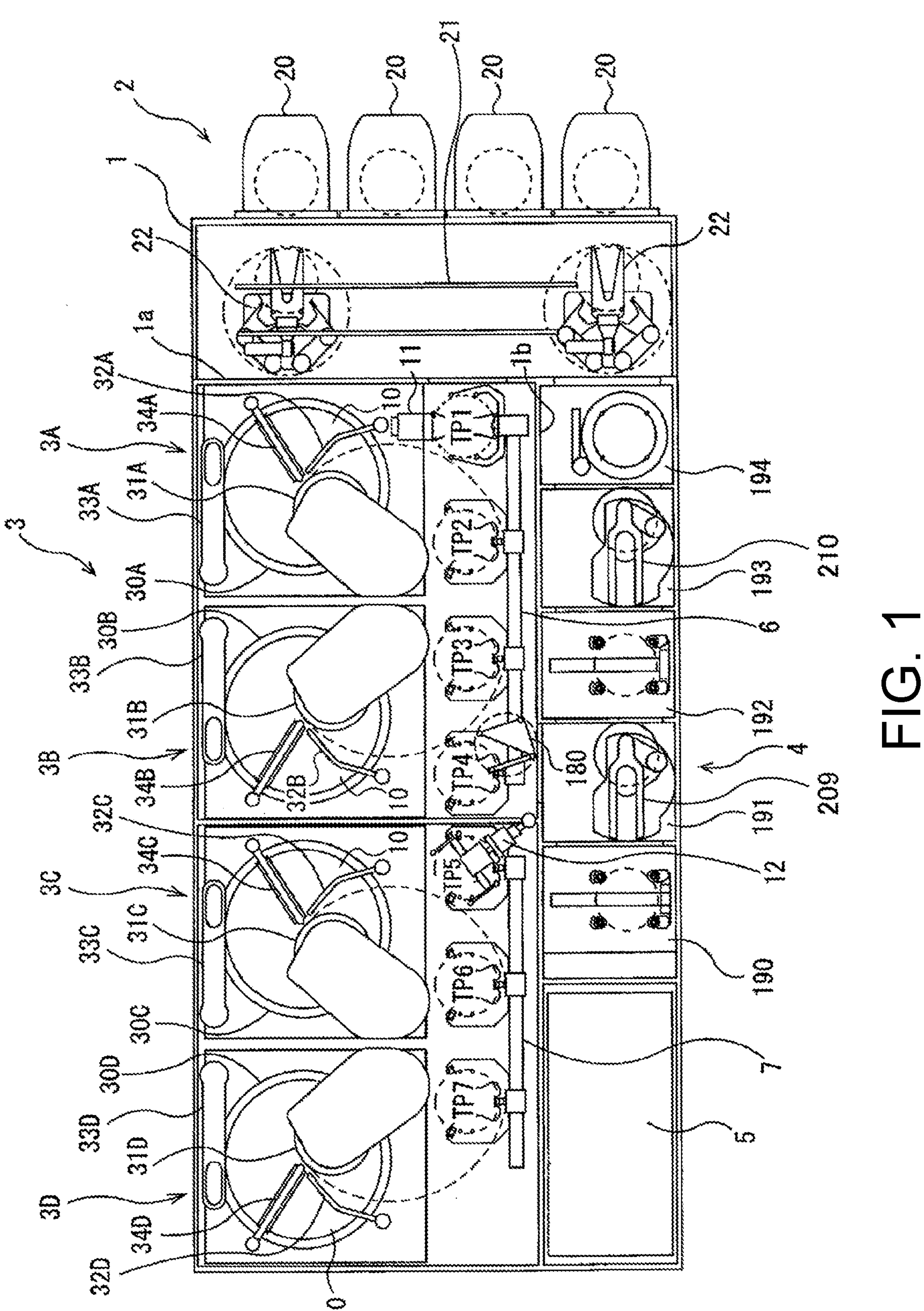
FIG. 1 is a plan view illustrating one embodiment of a substrate processing device.

FIG. 1 is a plan view illustrating one embodiment of a substrate processing device. As shown in FIG. 1, a substrate processing device has a substantially rectangular housing 1. The interior of the housing 1 is partitioned into a loading/unloading portion 2, a polishing portion 3, and a cleaning portion 4 by partition walls 1*a* and 1*b*.

The loading/unloading portion 2, the polishing portion 3, and the cleaning portion 4 are independently assembled and independently evacuated. The substrate processing device includes a control device 5 that controls substrate processing operations. The loading/unloading portion 2 includes two or more (four in this embodiment) front loading portions 20 on which wafer cassettes for stocking a large number of wafers (substrates) are placed.

The front loading portion 20 is arranged adjacent to the housing 1 and arranged along a width direction (perpendicular to a longitudinal direction) of the substrate processing device. The front loading portion 20 may be mounted with an open cassette, a SMIF (Standard Manufacturing Interface) pod, or a FOUP (Front Opening Unified Pod). SMIFs and FOUPs are closed containers that accommodate wafer cassettes and are covered with partition walls to maintain an environment independent of the external space.

A traveling mechanism 21 is provided in the loading/unloading portion 2 along the arrangement direction of the front loading portion 20, two conveyance robots (loaders) 22 movable along the arrangement direction of the wafer cassettes on the traveling mechanism 21. By moving on the traveling mechanism 21, the conveyance robot 22 may access the wafer cassette mounted on the front loading portion 20.

The polishing portion 3 is a region where wafer polishing (flattening) is performed, and includes a first polishing module 3A, a second polishing module 3B, a third polishing module 3C, and a fourth polishing module 3D. The first polishing module 3A, the second polishing module 3B, the third polishing module 3C, and the fourth polishing module 3D are arranged along the longitudinal direction of the substrate processing device, as shown in FIG. 1.

As shown in FIG. 1, the first polishing module 3A includes a polishing table 30A attached with a polishing pad 10 having a polishing surface; a top ring 31A for polishing while holding a wafer and pressing the wafer against the polishing pad 10 on the polishing table 30A; a polishing liquid supply nozzle 32A for supplying a polishing liquid or a dressing liquid (such as pure water) to the polishing pad 10; a dresser 33A for dressing the polishing surface of the polishing pad 10; and an atomizer 34A for atomizing a mixed fluid of liquid (such as pure water) and gas (such as nitrogen) or liquid (for example, pure water) and spraying it onto the polishing surface.

Similarly, the second polishing module 3B includes a polishing table 30B attached with the polishing pad 10, a top ring 31B, a polishing liquid supply nozzle 32B, a dresser 33B, and an atomizer 34B. The third polishing module 3C includes a polishing table 30C attached with the polishing pad 10, a top ring 31C, a polishing liquid supply nozzle 32C, a dresser 33C, and an atomizer 34C. The fourth polishing module 3D includes a polishing table 30D attached with the polishing pad 10, a top ring 31D, a polishing liquid supply nozzle 32D, a dresser 33D, and an atomizer 34D.

A conveyance mechanism for conveying a wafer will be described. As shown in FIG. 1, the substrate processing device includes a first linear transporter 6 arranged adjacent to the first polishing module 3A and the second polishing module 3B. The first linear transporter 6 is a mechanism that conveys a wafer between four conveyance positions (a first conveyance position TP1, a second conveyance position TP2, a third conveyance position TP3, and a fourth conveyance position TP4) along the arrangement direction of the polishing modules 3A and 3B.

The substrate processing device includes a second linear transporter 7 arranged adjacent to the third polishing module 3C and the fourth polishing module 3D. The second linear transporter 7 is a mechanism that conveys a wafer between three conveyance positions (a fifth conveyance position TP5, a sixth conveyance position TP6, and a seventh conveyance position TP7) along the arrangement direction of the polishing modules 3C and 3D.

The wafer is conveyed by the first linear transporter 6 to the polishing modules 3A and 3B. The top ring 31A of the first polishing module 3A moves between a polishing position and the second conveyance position TP2 by its swing operation. Thus, transfer of the wafer to the top ring 31A is performed at the second conveyance position TP2.

Similarly, the top ring 31B of the second polishing module 3B moves between a polishing position and the third conveyance position TP3, and transfer of the wafer to the top ring 31B is performed at the third conveyance position TP3. The top ring 31C of the third polishing module 3C moves between a polishing position and the sixth conveyance position TP6, and transfer of the wafer to the top ring 31C is performed at the sixth conveyance position TP6. The top ring 31D of the fourth polishing module 3D moves between a polishing position and the seventh conveyance position TP7, and transfer of the wafer to the top ring 31D is performed at the seventh conveyance position TP7.

A lifter 11 for receiving the wafer from the conveyance robot 22 is arranged at the first conveyance position TP1. The wafer is transferred from the conveyance robot 22 to the first linear transporter 6 via the lifter 11.

The substrate processing device includes a shutter (not shown) provided on the partition wall 1*a*. The shutter is arranged between the lifter 11 and the conveyance robot 22. When conveying the wafer, the shutter is opened and the wafer is transferred from the conveyance robot 22 to the lifter 11. A swing transporter 12 is arranged between the first linear transporter 6, the second linear transporter 7 and the cleaning portion 4.

The swing transporter 12 includes a hand that may move between the fourth conveyance position TP4 and the fifth conveyance position TP5. The transfer of the wafer from the first linear transporter 6 to the second linear transporter 7 is performed by the swing transporter 12. The wafer is conveyed by the second linear transporter 7 to the third polishing module 3C and/or the fourth polishing module 3D. The wafer polished by the polishing portion 3 is conveyed to the cleaning portion 4 via a temporary setting table 180 by the swing transporter 12. That is, the swing transporter 12 holds the wafer positioned at the fourth conveyance position TP4 or the fifth conveyance position TP5, turns over the wafer, and then conveys the wafer to the temporary setting table 180. As a result, the wafer is placed on the temporary setting table 180 with its device surface facing upward.

(a) of FIG. 2 is a plan view illustrating a cleaning portion, and (b) of FIG. 2 is a side view illustrating a cleaning portion. As shown in (a) and (b) of FIG. 2, the cleaning portion 4 includes a first cleaning chamber 190, a first conveyance chamber 191, a second cleaning chamber 192, a second conveyance chamber 193, and a drying chamber 194. In the first cleaning chamber 190, an upper primary cleaning module 201A and a lower primary cleaning module 201B are arranged along a vertical direction.

The upper primary cleaning module 201A is arranged above the lower primary cleaning module 201B. Similarly, in the second cleaning chamber 192, an upper secondary cleaning module 202A and a lower secondary cleaning module 202B are arranged along the vertical direction. The upper secondary cleaning module 202A is arranged above the lower secondary cleaning module 202B. The primary and secondary cleaning modules 201A, 201B, 202A, 202B are cleaning machines that clean the wafer using cleaning liquid.

A temporary setting table 203 of wafer is provided between the upper secondary cleaning module 202A and the lower secondary cleaning module 202B. In the drying chamber 194, an upper drying module 205A and a lower drying module 205B are arranged along the vertical direction. The upper drying module 205A and the lower drying module 205B are isolated from each other.

Filter Fan devices 207, 207 for supplying clean air into the drying modules 205A, 205B are provided on the upper drying module 205A and the lower drying module 205B, respectively.

A vertically movable first conveyance robot 209 is arranged in the first conveyance chamber 191, and a vertically movable second conveyance robot 210 is arranged in the second conveyance chamber 193. The first conveyance robot 209 and the second conveyance robot 210 are movably supported respectively by extending support shafts 211 and 212 extending in the vertical direction.

The first conveyance robot 209 and the second conveyance robot 210 are vertically movable along the support shafts 211 and 212. The first conveyance robot 209 is arranged at a position accessible to the temporary setting table 180, as indicated by the dotted line in (a) of FIG. 2. When the first conveyance robot 209 accesses the temporary setting table 180, a shutter (not shown) provided on the partition wall 1*b* is opened.

The first conveyance robot 209 operates to convey the wafer W between the temporary setting table 180, the upper primary cleaning module 201A, the lower primary cleaning module 201B, the temporary setting table 203, the upper secondary cleaning module 202A, and the lower secondary cleaning module 202B.

The second conveyance robot 210 operates to convey the wafer W between the upper secondary cleaning module 202A, the lower secondary cleaning module 202B, the temporary setting table 203, the upper drying module 205A, and the lower drying module 205B.

The conveyance robot 22 shown in FIG. 1 takes out the wafer from the upper drying module 205A or the lower drying module 205B and returns the wafer to the wafer cassette. When the conveyance robot 22 accesses the drying modules 205A and 205B, the shutter (not shown) provided on the partition wall 1*a* is opened.

As described above, the wafer is conveyed through the loading/unloading portion 2, the polishing portion 3, and the cleaning portion 4 in order. As the wafer is conveyed to each module, the wafer is conveyed to the next module after its presence is detected by an optical sensor. In this embodiment, when the wafer is conveyed to modules such as the polishing modules 3A to 3D of the polishing portion 3 and the cleaning modules 201A, 201B, 202A, and 202B of the cleaning portion 4, the presence of the wafer is detected at the first conveyance position TP1 to the seventh conveyance position TP7.

The optical sensor may detect the presence of the wafer W without contact. However, if the wafer W is irradiated with light emitted from the optical sensor for a long time, photocorrosion occurs on the front surface (more specifically, the device surface) of the wafer W. Thus, the substrate processing device has a configuration for preventing photocorrosion from occurring on the front surface of the wafer W.

FIG. 3 is a view illustrating a transfer station arranged on a conveyance path of a wafer. As shown in FIG. 3, the substrate processing device includes a transfer station 301 arranged on the conveyance path of the wafer W. The conveyance path of the wafer W corresponds to a moving path of the wafer W when one wafer W is conveyed to the loading/unloading portion 2, the polishing portion 3 and the cleaning portion 4. The transfer station 301 corresponds to a conveyance position (for example, a space in which the conveyance positions TP2, TP3, TP6, and TP7, and the temporary setting tables 180 and 203 are arranged) when the wafer W is transferred to each module.

As shown in FIG. 3, the substrate processing device includes an optical sensor 302 for detecting presence or absence of the wafer W conveyed to the transfer station 301, and a placement stage 300 for placing the wafer W thereon. The placement stage 300 corresponds to each of the temporary setting tables 180 and 203, for example.

The optical sensor 302 includes a light projecting portion 302*a* that emits light and a light receiving portion 302*b* that receives the light emitted from the light projecting portion 302*a*. The light projecting portion 302*a* is arranged below an upper end of the placement stage 300 (i.e. a placement surface of the wafer W) so as to be positioned on a back surface side of the wafer W placed on the placement stage 300. The light receiving portion 302*b* is arranged above the upper end of the placement stage 300 so as to be positioned on a front surface side of the wafer W placed on the placement stage 300. In the embodiment shown in FIG. 3, the light projecting portion 302*a* and the light receiving portion 302*b* are arranged perpendicular to a conveyance direction (i.e. the horizontal direction) of the wafer W.

FIG. 4 is a view illustrating another embodiment of the light projecting portion and the light receiving portion. As shown in FIG. 4, the light projecting portion 302*a* and the light receiving portion 302*b* are arranged obliquely with respect to the conveyance direction (i.e. the horizontal direction) of the wafer W. In the embodiment shown in FIG. 4, the light projecting portion 302*a* is also arranged below the wafer W placed on the placement stage 300, and the light receiving portion 302*b* is also arranged above the wafer W h placed on the placement stage 300.

In the embodiment shown in FIGS. 3 and 4, the wafer W is placed on the placement stage 300 with its upper surface (i.e. device surface) facing upward. Thus, a back surface of the wafer W is irradiated with the light emitted from the light projecting portion 302*a*. With the light being projected onto the back surface of the wafer W, the device surface of the wafer W is not directly irradiated with the light, influence of the light on the device surface of the wafer W can be reduced. As a result, the occurrence of photocorrosion on the device surface of the wafer can be suppressed.

The light quantity (intensity) of the light emitted from the light projecting portion 302*a* is attenuated according to distance. In the embodiment shown in FIG. 4, the obliquely irradiated light is irradiated onto the back surface of the wafer W with its light amount (intensity) attenuated. Thus, the influence of light on the device surface of the wafer W can be further reduced, and as a result, the occurrence of photocorrosion on the device surface of the wafer can be further suppressed.

Further, by irradiating light obliquely, irradiation area on the back surface of the wafer W can be increased, such that the back surface of the wafer W can be prevented from being locally irradiated with the light. As a result, the occurrence of photocorrosion on the device surface of the wafer can be further suppressed.

As shown in FIGS. 3 and 4, the optical sensor 302 is electrically connected to the control device 5. The control device 5 is configured to control the light projecting operation (i.e. start and stop light irradiation) of the optical sensor 302 (more specifically, the light projecting portion 302*a*).

The light receiving portion 302*b* is configured to transmit a detection signal to the control device 5 when the light receiving portion 302*b* receives the light emitted from the light projecting portion 302*a*. When the control device 5 receives the detection signal from the light receiving portion 302*b*, the control device 5 determines that the wafer W is not present on the placement stage 300. When the light emitted from the light projecting portion 302*a* is blocked by the wafer W, the light receiving portion 302*b* does not detect the light emitted from the light projecting portion 302*a*, and stops transmitting the detection signal to the control device

5. The control device 5 determines that the wafer W is placed on the placement stage 300 based on the stop of transmission of the detection signal.

The control device 5 includes a storage device 5*a* storing programs, and a processing device 5*b* that executes operations according to the programs. The control device 5, which is composed of a computer, operates according to a program electrically stored in the storage device 5*a*. The program causes the processing device 5*b* to execute a light projecting operation of the optical sensor 302.

A program for causing the processing device 5*b* to execute the light projecting operation is stored in a tangible non-transitory computer-readable recording medium and provided to the control device 5 via the recording medium. Alternatively, the program may be input to the control device 5 from a communication device (not shown) via a communication network such as the Internet or a local area network. The recording medium records not only a program for causing the processing device 5*b* to perform the light projecting operation, but also a program (to be described later) for preventing photocorrosion from occurring on the front surface of the wafer W.

(a) to (c) of FIG. 5 are views illustrating the wafer conveyed into a transfer station. FIG. 6 is a view illustrating a control flow of light projecting operation of an optical sensor by a control device when the wafer is conveyed into a transfer station. FIG. 7 is a view illustrating one embodiment of an operation of a control device for conveying the wafer into a transfer station and conveying the wafer out from the transfer station.

In the embodiment shown below, an example in which the wafer W polished in the polishing portion 3 is conveyed to the cleaning portion 4 will be described. Thus, the placement stage 300 arranged in the transfer station 301 corresponds to the temporary setting table 180 (see FIG. 1). The swing transporter 12 and the first conveyance robot 209 (see FIG. 1) may access the temporary setting table 180 of the transfer station 301.

The control device 5 is configured to: convey the wafer W into the transfer station 301, irradiate the light from the optical sensor 302 by operating the optical sensor 302, and before the wafer W is conveyed out from the transfer station 301, stop light irradiation from the optical sensor 302 by operating the optical sensor 302.

More specifically, as shown in (a) of FIG. 5 and step S101 in FIG. 6, the control device 5 starts light irradiation from the light projecting portion 302*a* (light projection ON), and starts a convey-in operation of the wafer W. In one embodiment, the control device 5 may continue light irradiation from the light projecting portion 302*a* during a period from when a previous wafer W is conveyed out from the transfer station 301 until a next wafer W is conveyed into the transfer station 301. With such a configuration, it is not necessary to determine a trigger for starting light irradiation from the light projecting portion 302*a* before the next wafer W is conveyed into the transfer station 301.

In one embodiment, the control device 5 may also stop light irradiation from the light projecting portion 302*a* (light projection OFF) after the previous wafer W is conveyed out from the transfer station 301, and start light irradiation from the light projecting portion 302*a* when the next wafer W is conveyed into the transfer station 301 (light projection ON). The control device 5 may also start light irradiation at a time when the swing transporter 12 starts the convey-in operation of the wafer W (more specifically, at the timing when the swing transporter 12 holding the wafer W changes its direction to the transfer station 301, for example. With such a configuration, the light from the optical sensor 302 is intermittently irradiated, thus life of the optical sensor 302 can be extended.

As shown in (b) of FIG. 5, when the wafer W is conveyed into the transfer station 301 by the swing transporter 12, light irradiated from the light projecting portion 302*a* is blocked by the wafer W. In the embodiment shown in FIG. 7, after the light irradiated from the optical sensor 302 is blocked by the wafer W conveyed into the transfer station 301, the control device 5 starts to confirm the presence of the wafer W when the wafer W is placed on the placement stage 300. In other words, the control device 5 starts to confirm the presence of the wafer W when the convey-in operation of the wafer W is completed. With such a configuration, the control device 5 may determine that the wafer W has been securely placed on the placement stage 300.

If the placement stage 300 has a chuck that holds the wafer W, triggered by closing of the chuck of the placement stage 300, the control device 5 starts to confirm the presence of the wafer W. If the placement stage 300 does not have a chuck, the control device 5 starts to confirm the presence of the wafer W when the swing transporter 12 sends out a signal indicating that the convey-in operation of the wafer W is completed. For example, the signal is sent out when the swing transporter 12 is lowered to a lowest position.

After completing the convey-in operation of the wafer W (see step S102 in FIG. 6), the control device 5 determines whether or not the light received by the light receiving portion 302*b* is blocked after confirmation of the presence of the wafer W is started until a predetermined time elapses (see step S103 in FIG. 6). If light reception is blocked until a predetermined time elapses (see "YES" in step S103 in FIG. 6), the control device 5 stops light irradiation from the light projecting portion 302*a* (see (c) of FIG. 5 and step S104 in FIG. 6), and at the same time ends the confirmation of the presence of the wafer W (see FIG. 7).

In this embodiment, the predetermined time is 0.3 seconds or less, but the predetermined time may be set according to the resolution of the optical sensor 302. If the optical sensor 302 has a relatively high resolution, the predetermined time may be 20 milliseconds or less.

Conventionally, during a period from before the wafer W is conveyed into the transfer station 301 until it is conveyed out from the transfer station 301, the light from the optical sensor 302 is continuously irradiated, thus an outer front surface of the wafer W is continuously irradiated with the light while the wafer W is staying at the transfer station 301. Thus, the possibility of photocorrosion occurring on the outer front surface and inside of the wafer W is high.

According to this embodiment, the control device 5 is configured to: convey the wafer W into the transfer station 301, start light irradiation from the optical sensor 302, and stop light irradiation from the optical sensor 302 before the wafer W is conveyed out from the transfer station 301. Therefore, the problem that the light from the optical sensor 302 continues to irradiate the wafer W does not occur. As a result, the control device 5 can prevent photocorrosion from occurring on the outer front surface and inside of the wafer W.

As shown in FIG. 6, if light reception is not blocked until the predetermined time elapses (see "NO" in step S103 of FIG. 6), the control device 5 determines that an abnormality has occurred in a device such as the optical sensor 302 or the swing transporter 12 or in the wafer W, and gives an abnormality alarm (see step S105 in FIG. 6). Then, the control device 5 stops light irradiation from the light projecting portion 302*a* (see step S106 in FIG. 6).

Moreover, in step S103 of FIG. 6, whether or not light reception continues to be blocked until a predetermined time elapses may also be determined. As a result, it is possible to prevent erroneous detection when light is blocked in a very short time due to environmental disturbances such as water, and to detect that the wafer W is broken on the hand of the swing transporter 12.

(a) and (b) of FIG. 8 are views illustrating a wafer conveyed out from the transfer station. FIG. 9 is a view illustrating a control flow of light projecting operation of an optical sensor by a control device when a wafer is conveyed out from a transfer station. As shown in FIG. 7 and (a) of FIG. 8, if the wafer W placed on the placement stage 300 is conveyed out from the transfer station 301, the control device 5 opens a shutter 305 provided at the transfer station 301 and starts a convey-out operation of the wafer W.

After opening the shutter 305, the control device 5 causes the first conveyance robot 209 to access the wafer W on the placement stage 300. The wafer W is conveyed out from the transfer station 301 while being held by the first conveyance robot 209. The control device 5 closes the shutter 305 and completes the convey-out operation of the wafer W (see (b) of FIG. 8 and step S201 in FIG. 9).

As shown in FIG. 7 and (b) of FIG. 8, triggered by the closing of the shutter 305, the control device 5 starts light irradiation from the light projecting portion 302*a*, and starts to confirm the presence of the wafer W (see step S202 in FIG. 9). As shown in step S203 of FIG. 9, the control device 5 determines whether or not light reception is blocked during a period from when confirmation of the presence of the wafer W is started until a predetermined time elapses. In this case, the predetermined time may also be determined as a very short time according to the resolution of the optical sensor 302 (for example, 0.3 seconds or less, 20 milliseconds or less).

When light reception is not blocked for the predetermined time (see "NO" in step S203 of FIG. 9), the control device 5 determines that the wafer W is not present on the placement stage 300, ends confirmation of the presence of the wafer W, and stops light irradiation from the light projecting portion 302*a* (see step S204 in FIG. 9). By this operation, the control device 5 can prevent the wafer W from being missed from the placement stage 300.

When light reception is blocked (see "YES" in step S203 of FIG. 9), for example, when the first conveyance robot 209 misses the wafer W, the control device 5 determines that the wafer W is present on the placement stage 300, and gives an abnormality alarm (see step S205 in FIG. 9). Then, light irradiation from the light projecting portion 302*a* is stopped (see step S206 in FIG. 9).

FIG. 10 is a view illustrating how presence of a wafer is confirmed before the wafer is conveyed out from the transfer station. FIG. 11 is a view illustrating a control flow of light projecting operation of an optical sensor by a control device before a wafer is conveyed out from the transfer station. As shown in FIGS. 10 and 11, the control device 5 may confirm the presence of the wafer W when the wafer W placed on the placement stage 300 is conveyed out from the transfer station 301.

More specifically, triggered by the opening of the shutter 305, the control device 5 starts light irradiation from the light projecting portion 302*a* (see step S301 in FIGS. 10 and 11), and starts to confirm the presence of the wafer W. The control device 5 determines whether or not light reception by the light receiving portion 302*b* is blocked during a period from when the confirmation of the presence of the wafer W is started until a predetermined time elapses (see step S302 in FIG. 11). If the light reception is blocked (see "YES" in step S302 of FIG. 11), the control device 5 determines that the wafer W is placed on the placement stage 300, and ends confirmation of the presence of the wafer W. At this time, the control device 5 ends light irradiation from the light projecting portion 302*a* (see step S303 in FIG. 11). Thereafter, the control device 5 performs the same operations as steps S201 to S203 of FIG. 9.

If light reception is not blocked until the predetermined time elapses (see "NO" in step S302 of FIG. 11), the control device 5 determines that an abnormality has occurred in a device such as the optical sensor 302 or the wafer W, and gives an abnormality alarm (see step S304 in FIG. 11). Then, the control device 5 ends light irradiation from the light projecting portion 302*a* (see step S305 in FIG. 11).

In the embodiment shown in FIG. 10, the control device 5 confirms whether or not the wafer W is present on the placement stage 300 before the wafer W is conveyed out from the transfer station 301. After the control device 5 determines that the wafer W is present on the placement stage 300, the wafer W is conveyed out from the transfer station 301 by the first conveyance robot 209. With such a configuration, it is possible to avoid a situation in which the wafer W is not present on the placement stage 300 when the first conveyance robot 209 tries to convey out the wafer W.

FIG. 12 is a view illustrating a control flow of light projecting operation of an optical sensor by a control device when a wafer is conveyed into the transfer station. FIG. 13 is a view illustrating another embodiment of an operation of a control device for conveying a wafer into the transfer station and conveying the wafer out from the transfer station.

As shown in step S401 of FIG. 12 and FIG. 13, the control device 5 starts light irradiation from the light projecting portion 302*a*, and starts the convey-in operation of the wafer W. Then, after detecting that the light is blocked by the wafer W, the control device 5 is triggered to stop light irradiation from the light projecting portion 302*a* after a predetermined time has elapsed (see FIG. 13).

In a state in which light is irradiated from the light projecting portion 302*a* (see step S401), the control device 5 starts to confirm the presence of the wafer W, and determines whether or not light reception by the light receiving portion 302*b* is blocked (see step S402 in FIG. 12).

When the swing transporter 12 conveys the wafer W into the transfer station 301, the light is blocked by an edge of the wafer W, and the light reception of the light receiving portion 302*b* is blocked (see "YES" in step S402). After detecting that the light reception of the light receiving portion 302*b* is blocked (i.e. after "YES" in step S402), the control device 5 determines whether or not the predetermined time has elapsed (see step S403). This determination is continued until a predetermined time elapses (see "NO" in step S403). When the predetermined time has elapsed (see "YES" in step S403), the control device 5 stops light irradiation from the light projecting portion 302*a* (see step S404).

If the light reception of the light receiving portion 302*b* is not blocked even though the hand of the swing transporter 12 is extended toward the placement stage 300 (see "NO" in step S402), the control device 5 gives an abnormality alarm (see step S405), and stops light irradiation from the light projecting portion 302*a* (see step S406). Moreover, in a case when the light receiving portion 302*b* receives light again before the predetermined time elapses, the control device 5 may give an abnormality alarm or may return to step S402.

Further, in FIG. 13, although the confirmation of the presence of the wafer is started at the same time as when the blocking of light reception is started, the confirmation of the presence of the wafer may actually also be started slightly before the light reception is blocked by the wafer.

With such a configuration, the time during which the light from the optical sensor 302 is irradiated on the wafer W can be further shortened, thus the control device 5 can prevent photocorrosion from occurring on the front surface of wafer W more reliably.

The embodiment shown in FIG. 10 is also applicable to the embodiment shown in FIG. 13. More specifically, in the embodiment shown in FIG. 13, the control device 5 may also confirm whether or not the wafer W is present on the placement stage 300 before the wafer W is conveyed out from the transfer station 301.

FIG. 14 is a view illustrating a control flow of light projecting operation of an optical sensor by a control device when a wafer is conveyed into the transfer station. FIG. 15 is a view illustrating another embodiment of an operation of a control device for conveying a wafer into the transfer station and conveying the wafer out from the transfer station.

As shown in steps S501 and S502 of FIG. 14 and FIG. 15, the control device 5 starts light irradiation at the timing when the swing transporter 12 starts the convey-in operation of the wafer W, and starts to confirm the presence of the wafer W.

The control device 5 determines whether or not the light reception of the light receiving portion 302*b* is blocked during a period from when the confirmation of the presence of the wafer W is started until a predetermined time elapses (see step S503 in FIG. 14). If light reception is not blocked until the predetermined time elapses (see "NO" in step S503 of FIG. 14), the control device 5 stops light irradiation from the light projecting portion 302*a* (see step S504 in FIG. 14), and at the same time confirms that the wafer W is not present on the placement stage 300 (see FIG. 15).

If light reception is blocked until the predetermined time elapses (see "YES" in step S503 of FIG. 14), the control device 5 determines that the previous wafer W is present on the placement stage 300, and gives an abnormality alarm (see step S505 in FIG. 14). Then, the control device 5 ends light irradiation from the light projecting portion 302*a* (see step S506 in FIG. 14).

After step S504 in FIG. 14, the control device 5 starts light irradiation from the optical sensor 302 at the time when the convey-in operation of the wafer W is completed (see step S507 in FIG. 14), in other words, when the wafer has been placed on the placement stage 300 (see step S508 in FIG. 14). When the light irradiated from the optical sensor 302 is blocked by the wafer W placed on the placement stage 300, the control device 5 starts to confirm the presence of the wafer W (see FIG. 15). With such a configuration, the control device 5 may determine that the wafer W has been securely placed on the placement stage 300 and further shorten the time during which light from the optical sensor 302 is irradiated on the wafer W.

The control device 5 determines whether or not the light reception of the light receiving portion 302*b* is blocked during a period from the time when confirmation of the presence of the wafer W is started until a predetermined time elapses (see step S509 in FIG. 14). If the light reception is blocked until the predetermined time elapses (see "YES" in step 509 of FIG. 14), the control device 5 stops light irradiation from the light projecting portion 302*a* (see step S510 in FIG. 14), and at the same time ends the confirmation of the presence of the wafer W (see FIG. 15).

If light reception is not blocked until the predetermined time elapses (see "NO" in step S509 of FIG. 14), the control device 5 gives an abnormality alarm (see step S511 in FIG. 14), and stops light irradiation from the light projecting portion 302*a* (see step S512 in FIG. 14).

Then, the control device 5 performs the same operation flow as the operation flow when conveying the wafer W out from the transfer station 301 (see FIG. 9), and conveying the wafer W out from the transfer station 301.

The embodiment shown in FIG. 10 is also applicable to the embodiment shown in FIG. 15. More specifically, in the embodiment shown in FIG. 15, the control device 5 may also confirm whether or not the wafer W is present on the placement stage 300 before the wafer W is conveyed out from the transfer station 301. In the case of the embodiment shown in Figures (a) of 5 to 10, in the confirmation of the presence of the wafer W, the control device 5 determines that the wafer W is present if the light reception of the light receiving portion 302*b* is blocked by the wafer W, and that the wafer W is not present if the light reception is not blocked.

In the embodiment described above, the control of the light projecting operation of the optical sensor 302 by the control device 5 when the wafer W is conveyed from the polishing portion 3 to the cleaning portion 4 via the transfer station 301 has been described, but the control of the light projecting operation of the optical sensor 302 is not limited to the embodiment described above.

In one embodiment, the control of the light projecting operation of the optical sensor 302 by the control device 5 may also be performed when the wafer W is conveyed from the loading/unloading portion 2 to the polishing portion 3. More specifically, the presence or absence of the wafer W is confirmed on the linear transporter at each of the conveyance position TP1 to conveyance position TP7.

In one embodiment, the control of the light projecting operation of the optical sensor 302 may be performed when the wafer W is conveyed into the first cleaning chamber 190 (the cleaning modules 201A, 201B), the second cleaning chamber 192 (the cleaning modules 202A, 202B), or the drying chamber 194 (the drying modules 205A, 205B).

In the embodiment described above, the control of the light projecting operation of the optical sensor 302 in the transfer station 301 corresponding to the conveyance position when the wafer W is transferred to each module has been described, but the control of the light projecting operation of the optical sensor 302 may also be performed on the lifter 11 and the first linear transporter 6 at the first conveyance position TP1 to the fourth conveyance position TP4.

The control of the light projecting operation of the optical sensor 302 may be performed by the second linear transporter 7 at the fifth conveyance position TP5 to the seventh conveyance position TP7, and may also be performed at each module (the primary cleaning modules 201, the secondary cleaning modules 202, the drying modules 205) of the temporary setting table 180, the temporary setting table 203, and the cleaning portion 4. In this way, the control of the light projecting operation of the optical sensor 302 does not necessarily have to be performed at the transfer station 301, and may be performed at each module. The transfer station 301 and each module in which the light projecting operation of the optical sensor 302 is controlled are collectively referred to as a receiving unit.

Photocorrosion is likely to occur particularly when the wafer W is wet. Therefore, the effect of controlling light projecting operation of the optical sensor 302 is particularly effective in the process after the wafer W is wet-processed. As the wet-processing module that wet-processes the wafer W, the polishing modules 3A to 3D and the cleaning modules 201A, 201B, 202A, and 202B may be given as examples.

The wet-processing module is arranged on a front stage side of the transfer station 301 in the conveyance direction of the wafer W, and the optical sensor 302 is configured to irradiate the wafer W wet-processed in the wet-processing module with light. With such a configuration, the substrate processing device can prevent photocorrosion from occurring on the front surface of the wafer W more effectively.

The above-described embodiments are described so as to enable a person having ordinary knowledge in the art to implement the disclosure. Various modifications of the above-described embodiments may be naturally made by a person having ordinary skill in the art, and the technical idea of the disclosure may also be applied to other embodiments. Therefore, the disclosure should not be limited to the described embodiments, but should have the broadest scope in accordance with the spirit defined by the claims.

What is claimed is:

1. A substrate processing device, comprising:

a receiving unit for a substrate;

a swing transporter, configured to convey the substrate into the receiving unit;

an optical sensor for detecting presence or absence of the substrate conveyed to the receiving unit; and a control device for controlling a light projecting operation of the optical sensor which starts and stops a light irradiation that irradiates a light, wherein the control device is configured to:

start the light irradiation from the optical sensor to irradiate the light when the substrate is placed on a placement stage of the receiving unit:

convey the substrate into the receiving unit and confirm that the substrate is present in the receiving unit by detecting that the light irradiated from the optical sensor is blocked by the substrate conveyed to the receiving unit;

stop the light irradiation from the optical sensor before the substrate is conveyed out from the receiving unit;

confirm presence of the substrate in the receiving unit during a period from when the substrate is placed on the placement stage of the receiving unit until a predetermined time elapses after the light irradiated from the optical sensor is blocked by the substrate conveyed into the receiving unit; and stop the light irradiation from the optical sensor after the predetermined time has elapsed, wherein the control device is further configured, so that:

after completing a convey-in operation of the substrate by the swing transporter, the control device determines whether or not a light reception of the optical sensor is blocked after confirmation of the presence of the substrate is started until the predetermined time elapses, wherein if the light reception is blocked until the predetermined time elapses, the control device stops the light irradiation from the optical sensor and at the same time ends confirmation of the presence of the substrate.

2. The substrate processing device according to claim 1, wherein the substrate processing device includes a wet-processing module arranged on a front stage side of the receiving unit in a conveyance direction of the substrate and wet-processing the substrate, and the optical sensor irradiates light on the substrate wet-processed in the wet-processing module.

3. The substrate processing device according to claim 1, wherein the control device starts light irradiation from the optical sensor before the substrate is conveyed to the receiving unit and stops light irradiation from the optical sensor after confirming that the substrate is not present in the receiving unit.

4. The substrate processing device according to claim 1, wherein the optical sensor comprises:

a light projecting portion for emitting the light;

a light receiving portion for receiving the light emitted from the light projecting portion, wherein the light projecting portion is arranged on a back surface side of the substrate conveyed to the receiving unit, and the light receiving portion is arranged on a front surface side of the substrate conveyed to the receiving unit.

5. The substrate processing device according to claim 4, wherein the light projecting portion and the light receiving portion are arranged perpendicularly to a conveyance direction of the substrate.

6. The substrate processing device according to claim 4, wherein the light projecting portion and the light receiving portion are arranged obliquely with respect to a conveyance direction of the substrate.

7. A non-transitory computer-readable recording medium that records a program for causing a computer to:

start a light irradiation from an optical sensor to irradiate a light when a substrate is placed on a placement stage of a receiving unit;

convey the substrate into the receiving unit for the substrate and confirm that the substrate is present in the receiving unit by detecting that the light irradiated from the optical sensor is blocked by the substrate conveyed to the receiving unit;

stop the light irradiation from the optical sensor before the substrate is conveyed out from the receiving unit;

confirm presence of the substrate in the receiving unit during a period from when the substrate is placed on the placement stage of the receiving unit until a predetermined time elapses after the light irradiated from the optical sensor is blocked by the substrate conveyed into the receiving unit; and stop the light irradiation from the optical sensor after the predetermined time has elapsed, wherein the computer is further configured, so that:

after completing a convey-in operation of the substrate by a swing transporter configured to convey the substrate into the receiving unit, the computer determines whether or not a light reception of the optical sensor is blocked after confirmation of the presence of the substrate is started until the predetermined time elapses, wherein if the light reception is blocked until the predetermined time elapses, the computer stops the light irradiation from the optical sensor and at the same time ends confirmation of the presence of the substrate.

8. The recording medium according to claim 7, recording a program for causing a computer to:

wet-process the substrate in a wet-processing module arranged on a front stage side of the receiving unit in a conveyance direction of the substrate and wet-process the substrate, and irradiate the substrate wet-processed in the wet-processing module with the light by the optical sensor.

* * * * *